(12) United States Patent
Wang et al.

(10) Patent No.: US 7,375,398 B2
(45) Date of Patent: May 20, 2008

(54) HIGH VOLTAGE FET GATE STRUCTURE (75) Inventors: Bin Wang, Seattle, WA (US);
Chih-Hsin Wang, San Jose, CA (US)

(73) Assignee: IMPINJ, Inc., Seattle, WA (US)

( * ) Notice: Subject to any disclaimer, the term of this patent is extended or adjusted under 35 U.S.C. 154(b) by 84 days.

(21) Appl. No.: 11/138,888

(22) Filed: May 26, 2005

(65) Prior Publication Data

US 2006/0001050 A1 Jan. 5, 2006

Related U.S. Application Data (63) Continuation-in-part of application No. 10/884,326, filed on Jul. 2, 2004, and a continuation-in-part of application No. 10/884,236, filed on Jul. 2, 2004, and a continuation-in-part of application No. 10/952,708, filed on Sep. 28, 2004.

(51) Int. Cl.
*H01L 23/62* (2006.01)
(52) U.S. Cl. .................. 257/355; 257/213; 257/367; 257/409; 257/E29.006; 438/142
(58) Field of Classification Search ............... 257/369, 257/E27.114, E29.068, E29.109, E21.04, 257/E21.085, 213, 355, 367, 409, E29.006; 438/142
See application file for complete search history.

(56) References Cited

U.S. PATENT DOCUMENTS 4,745,079 A * 5/1988 Pfiester ................... 438/306
5,585,660 A * 12/1996 Mei ........................ 257/389
5,593,909 A * 1/1997 Han et al. ................ 438/306
5,753,952 A * 5/1998 Mehrad .................... 257/316
6,160,289 A * 12/2000 Kwon et al. .............. 257/335
6,350,637 B1 * 2/2002 Maurelli et al. ........... 438/197
6,461,918 B1 * 10/2002 Calafut .................... 438/270
6,548,874 B1 * 4/2003 Morton et al. ............ 257/371
6,555,883 B1 * 4/2003 Disney et al. ............. 257/401
6,989,302 B2 * 1/2006 Makovicka et al. ........ 438/199
7,091,535 B2 * 8/2006 Tsai et al. ................. 257/285

* cited by examiner

*Primary Examiner*—Anh D. Mai
*Assistant Examiner*—Christopher M Roland
(74) *Attorney, Agent, or Firm*—Merchant & Gould; Carl K. Turk (57) ABSTRACT A FET device for operation at high voltages includes a substrate, a first well and a second well within the substrate that are doped with implants of a first type and second type, respectively. The first and second wells define a p-n junction. A field oxide layer within the second well defines a first surface region to receive a drain contact. A third well is located at least partially in the first well, includes doped implants of the second type, and is adapted to receive a source contact. As such, the third well defines a channel between itself and the second well within the first well. A gate is disposed over the channel. At least a first portion of the gate is disposed over the p-n junction, and includes doped implants of the first type. A number of permutations are allowed for doping the remainder of the gate.

14 Claims, 6 Drawing Sheets

HIGH VOLTAGE FET GATE STRUCTURE

RELATED APPLICATIONS

This utility patent application may be found associated with U.S. patent application Ser. No. 10/884,326, filed Jul. 2, 2004 U.S. patent application Ser. No. 10/884,236, filed Jul. 2, 2004, U.S. patent application Ser. No. 10/884,326, filed Jul. 2, 2004 U.S. patent application Ser. No. 10/952,708, filed Sep. 28, 2004, U.S. patent application Ser. No. 10/884,326, filed Jul. 2, 2004 and Ser. No. 10/884,236, filed Jul. 2, 2004.

TECHNICAL FIELD

This invention relates generally to transistors, and more particularly, to field-effect transistors (FETs) that are capable of operating at high voltages.

BACKGROUND

Figure 1:
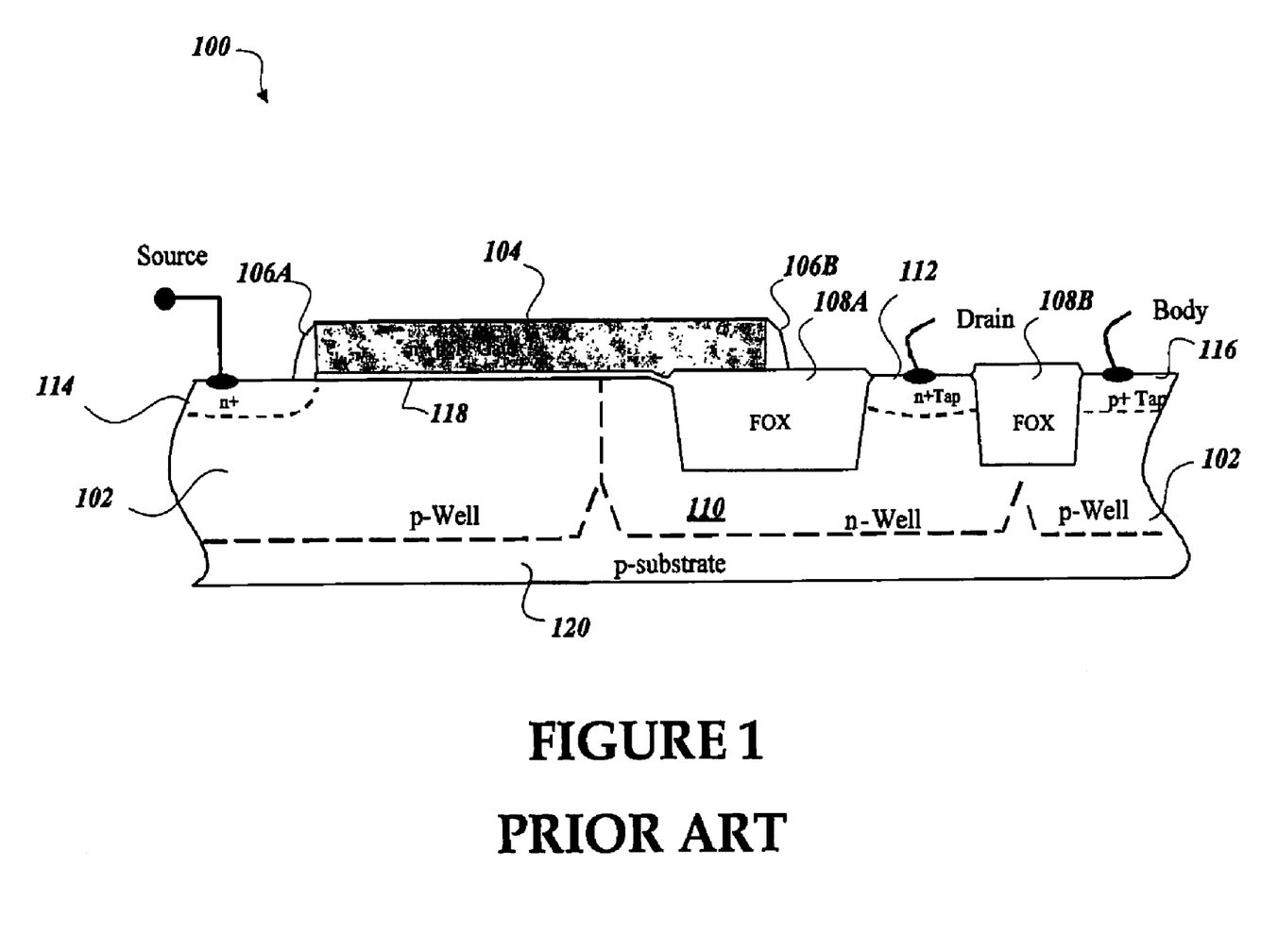
FIG. 1 is a cross-sectional view of a conventional n-channel complementary metal oxide semiconductor field effect transistor (CMOS FET)

FIG. 1 illustrates a high-voltage, n-channel, Metal-Oxide-Semiconductor, Field-Effect Transistor 100 in the prior art. The transistor 100 is formed on a p– substrate 120, which can be formed from silicon. Preferably the substrate 120 is doped relatively lightly ($10^{15}$ atoms per centimeter$^3$) with a p-type material, such as boron ions.

A p-well 102 and an n-well 110 are diffused or implanted into the p– substrate 120. The p-well 102 appears twice in FIG. 1, but that is only because it surrounds n-well 110, and FIG. 1 is taken at a cross section that shows the p-well 102 in two places. The n-well drain 110 and the p-well 102 are typically doped on the order of $10^{17}$ atoms per centimeter$^3$.

The transistor 100 has terminals that are provided for as follows. Contained within the n-well 110 is an n$^+$ region 112 ("n+ Tap"), which is suitable for receiving a drain contact. The p-well 102 also has a p$^+$ region 116 ("p+ Tap") that provides for an ohmic-contact for the body of the p– substrate 120 via the p-well 102. An n$^+$ well 114 is located at least in part of the p-well 102, which is adapted to receive a source contact. The n$^+$ well 114 contains an abundance of n-type material, such as arsenic ions. In fact, the plus (+) sign next to either the letter "n" or the letter "p" indicates an overabundant doping of a particular n-type material or p-type material, which can be of the order of $10^{20}$ atoms per centimeter$^3$.

A thin gate dielectric layer 118 is disposed or grown onto the p– substrate 120. The layer 118 can be formed integrally with a thick field oxide ("FOX") layer 108A, which operates as a stop.

An n$^+$ polysilicon gate 104 is formed onto gate layer 118. The gate 104 is suitable for receiving a gate contact (not shown). Sidewall spacers 106A, 106B are formed on either side of the gate 104.

Accordingly, an active region for the transistor 100 is defined under the gate 104. A channel for the transistor 100 is defined in the active region, within the p-well 102, between the n$^+$ well 114 and the n-well 110. The thick FOX stop 108A, and another FOX stop 108B act as shallow trend isolation ("STI") to prevent inadvertent channel formation outside of the active region of the transistor 100.

So, when a positive voltage is applied to the n$^+$ polysilicon gate 104 relative to the p-well 102, positive charges are, in effect, deposited on it. In response, negative charges are induced in the underlying p-well 102 by the formation of a depletion region and a thin inversion surface region near the gate dielectric layer containing mobile electrons, resulting in conductible current. These induced mobile electrons form the channel of the transistor 100, and allow current to flow between the n-well 110 and the n$^+$ source 114, in a direction that depends on the sizes of the biasing voltages.

In the transistor 100, no current flows from the n-well 110 to the n$^+$ source 114 without a conducting n-channel between them, since the drain-body-source combination includes oppositely directed p-n junctions in series, which can be likened to diodes whose cathodes are coupled together.

Indeed, in the transistor 100, a natural p-n junction is created between the p-well 102 and the adjacent n-well 110. It should be noted that the p-well 102 and the adjacent n-well 110 have doping of density that is intermediate between the lightly doped substrate 120 and the heavily doped contact areas, namely the n$^+$ region 112, the n$^+$ source 114, and p$^+$ region 116.

In conventional MOS transistors, the n$^+$ region 112 could act as the drain without providing the n-well 110. This, however, created significant problems when such transistors are used in high-voltage applications. For example, suppose a high voltage, such as 10V or more, were applied to the n$^+$ region 112 without the n-well 110. Such a high voltage can cause a breakdown of the operative p-n junction, allowing current to undesirably flow from the n$^+$ region 112 to the p-well 102, instead of to the n$^+$ source 114. The transistor 100 prevents such a breakdown because the n-well 110 places the natural p-n junction-well away from the n$^+$ region 112, which is therefore free to be interfaced to high voltages.

While this solution worked, it was discovered by the inventors that another problem appeared. When a sufficient voltage is introduced at the gate 104, breakdown of the natural p-n junction may occur. In fact, the voltage applied at the n$^+$ polysilicon gate 104 affects the breakdown voltage of the natural p-n junction formed by the n-well 110 and the p-well 102. The breakdown occurs because there is an overlap, where the n$^+$ polysilicon gate 104 extends over a portion of the n-well 110. The breakdown causes current to conduct undesirably from the n-well 110 to the p-substrate 120 instead of toward the n$^+$ source 114.

Without a resolution to the problem of undesired breakdown of the transistor 100, users may eventually no longer trust the reliability of computing devices built using transistors such as transistor 100. Thus, there is a need for a new transistor and method for inhibiting or alleviating the breakdown of p-n junctions while avoiding or reducing other problems associated with existing transistors.

SUMMARY

In one embodiment, an FET device includes a substrate, and a first well in the substrate that includes doped implants of a first type. A second well in the substrate includes doped implants of a second type, is adjacent to the first well, and defines a natural p-n junction with the first well. A first field oxide layer within the second well defines a first surface region, and a second surface region of the second well that is adapted to receive a drain contact. A third well is located at least partially in the first well, includes doped implants of the second type, and is adapted to receive a source contact. As such, the third well defines a channel between itself and the second well within the first well. A gate is disposed over the channel. At least a first portion of the gate is disposed over the natural p-n junction, and includes doped implants of the first type. A number of permutations are also allowed for doping the remainder of the gate.

Other embodiments and methods are also provided.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Embodiments are now described. It will be recognized that some aspects are similar to what was described above, which was included to better elucidate the novelty of the present disclosure.

Figure 2A:
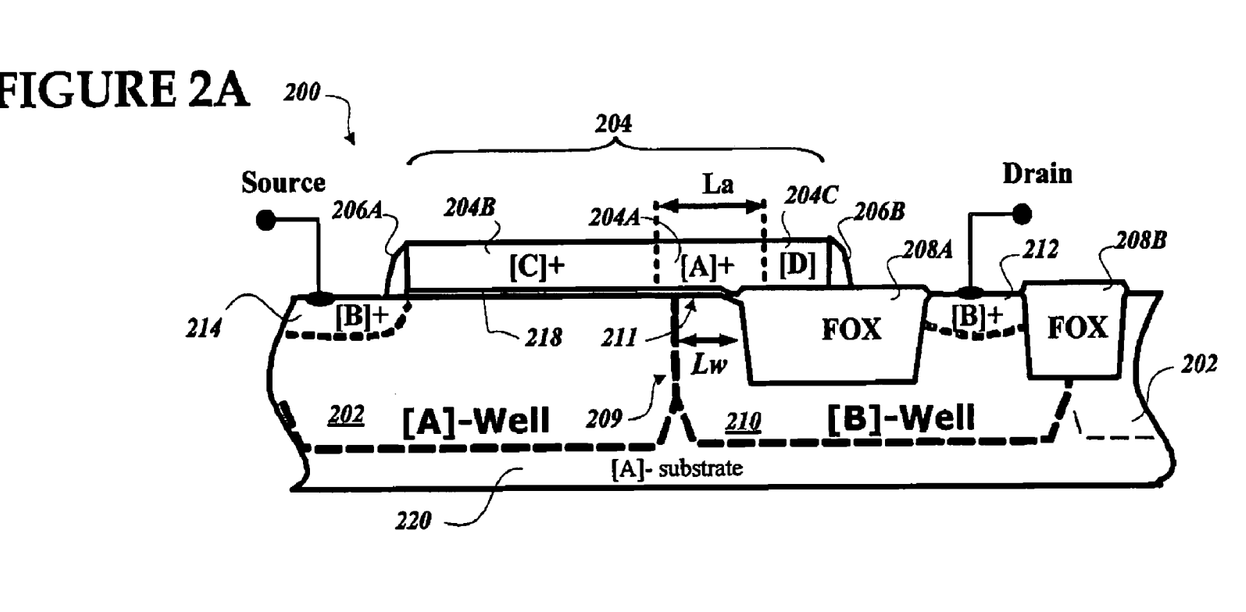
FIG. 2A is a cross-sectional view of a high voltage CMOS FET whose gate is structured according to embodiments.

FIG. 2A is a cross-sectional view of a high voltage CMOS FET 200, which is made according to embodiments. The transistor 200 is described in terms of areas and regions, for some of which there is a choice in doping. The choices are indicated by variables [A], [B], [C], and [D].

Figure 2B:
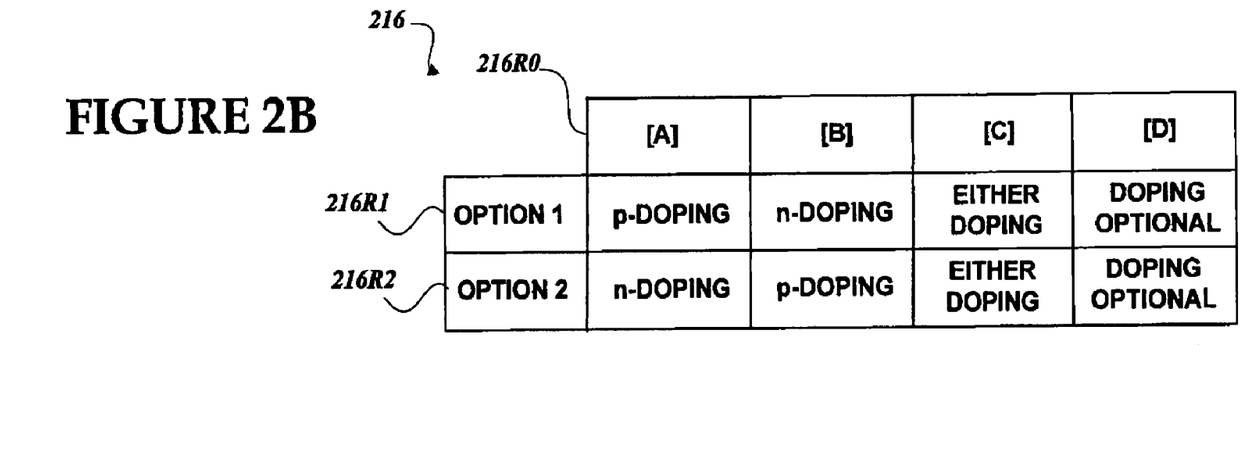
FIG. 2B is a matrix illustrating doping choices for various portions of the CMOS FET of FIG. 2A according to embodiments.

FIG. 2B is a matrix 216 illustrating combinations of doping choices for these areas and regions of transistor 200, according to embodiments. In fact, row 216R0 shows the available doping variables, and rows 216R1, 216R2 show the available combinations of choices for the variables, as Option 1 and Option 2 respectively.

Returning to FIG. 2A, the transistor 200 includes a substrate 220. The substrate 220 is preferably doped according to the [A−] variable.

A first well 202 formed in the substrate 220 includes doped implants of the [A] type. The first well 202 appears in two places, for reasons similar to what was described with reference to FIG. 1.

A second well 210 formed in the substrate 220 includes doped implants of the [B] type. The second well 210 is adjacent to the first well 202. The second well 210 defines a natural p-n junction 209 with the first well 202.

In terms of the particular doping, it will be seen that according to Option 1 of FIG. 2B, variable [A] is p-type and variable [B] is n-type. According to Option 2, the inverse doping types are applicable. The transistor 200 is therefore either an n-type or a p-type channel transistor. Some times, these types of doping are referred to in terms of areas that include doped implants of the first type and of the second type.

In terms of the doping concentrations, a person having skill in the art can determine values that operate well. In any event, such values can be similar to what was shown in FIG. 1 for similar areas.

The transistor 200 also includes a first field oxide ("FOX") layer 208A within the second well 210. Accordingly, the FOX layer 208A defines a first surface region 211 of the second well 210, which has a length Lw. The FOX layer 208A further defines a second surface region of the second well 210, which is adapted to receive a drain contact via a region 212 that is heavily doped according to the [B]$^+$ type.

The transistor 200 also includes a second FOX layer 208B at an edge of the second well 210. Accordingly, the FOX layer 208B permits placing an ohmic contact (not shown) for the body of the substrate 220 via the first well 202 near the drain contact.

The transistor 200 further includes a third well 214 that is located at least partially in the first well 202. Third well 214 includes doped implants of the [B]+ type, and is adapted to receive a source contact.

A thin gate dielectric layer 218 is disposed or grown onto the substrate 220. The layer 218 can be formed integrally with FOX layer 208A.

A polysilicon gate 204 is formed onto gate layer 218. The gate 204 is suitable for receiving a gate contact (not shown). Sidewall spacers 206A, 206B are formed on either side of the gate 204.

Accordingly, an active region for the transistor 200 is defined under the gate 204. A channel for the transistor 200 is defined in the active region, within the first well 202, between the third well 214 and the second well 210. The FOX layers 208A act as shallow trend isolation ("STI") to prevent inadvertent channel formation outside of the active region of the transistor 200.

The gate 204 can be considered as either unitary, or comprised of any combination of portions 204A, 204B, 204C, which can be doped similarly or differently, according to combinations illustrated in FIG. 2B. Portion 204B is doped according to variable [C]+, and portion 204C is doped according to variable [D].

Portion 204A of the gate 204 is disposed over the natural p-n junction 209. Preferably, the portion 204A extends over the entire first surface region 211. So, if the region 211 has a length Lw, the portion 204A has a length La that is at least as long as the length Lw, and even more preferably the portion 204A maintains the first surface region 211 within its footprint.

Portion 204A is doped similarly to that of the first well 202 (here, type [A]). Accordingly, portion 204A is doped oppositely to how the second well 210 at the first surface region 211 is doped. This type of doping enhances the breakdown voltage at a natural p-n junction formed by the second well 210 and the first well 202, thereby preventing undesired current from conducting from the second well 210 to the first well 202. Indeed, the doping combination of the gate portion 204A with that of the second well 210 causes the electric field to be decreased along the length of Lw, hence increasing the breakdown voltage of the natural p-n junction. This inhibits or alleviates the undesired conduction of current flow, and thus enhances the reliability of the transistor 200.

It will be appreciated that the various possibilities of the matrix 216 of FIG. 2B result in this desired effect. For example, the entire gate 204 can doped as the portion 204A. Alternately, different portions of the gate can be doped differently. A second portion can be doped differently than the first portion 204A, whether the second portion is the portion 204B (located over the channel), or the portion 204C.

It should be noted that the doping of the portion 204C does not matter. In fact, portion 204C need not be doped at all. It is therefore advantageous to have the portion 204C be doped the same as the portion 204A. One such example is described below.

Figure 3:
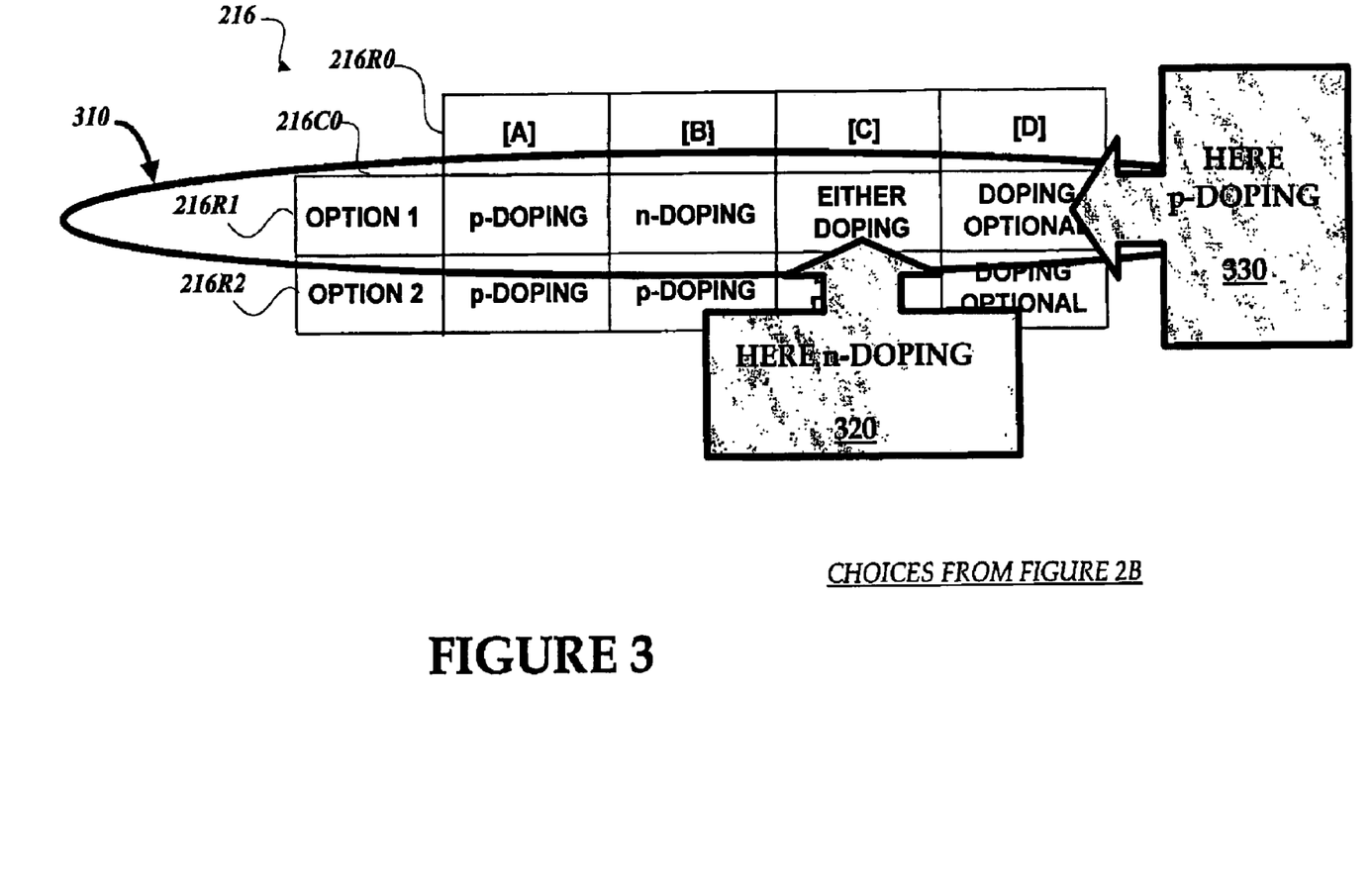
FIG. 3 is a repetition of the matrix of FIG. 2B, further showing example choices according to one embodiment.

FIG. 3 is a repetition of the matrix of FIG. 2B, further showing choices according to one embodiment. According to choice 310, Option 1 is selected according to row 216R1. According to choice 320, variable [C] will be n-type doping. And according to choice 330, variable [D] will be p-type doping.

Figure 4A:
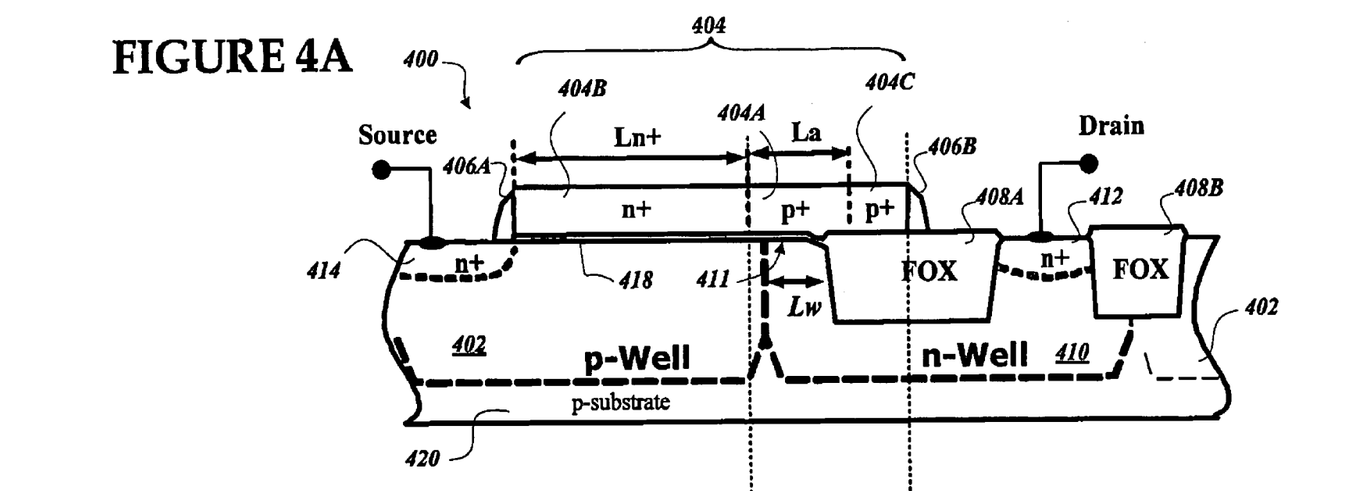
FIG. 4A is a cross-sectional view of an example high voltage n-channel CMOS FET resulting from applying the choices of FIG. 3 to the FET of FIG. 2A.

FIG. 4A is a cross-sectional view of an exemplary high voltage n-channel CMOS FET 400, which results from applying the choices of FIG. 3 to the FET of FIG. 2A.

The transistor 400 includes a p-substrate 420. A p-well 402 and an n-well 410 are formed in the substrate 420. A first FOX layer 408A is within the n-well 410, so as to define a first surface region 411 of the n-well 410, which has a length Lw. The FOX layer 408A further defines a second surface region of the n-well 410, which is adapted to receive a drain contact via a region 412. Another FOX layer 408B permits placing an ohmic contact (not shown) for the body of the substrate 420 via the first well 402 near the drain contact. The transistor 400 further includes another n-well 414 that is located at least partially in the p-well 402, and is adapted to receive a source contact.

A thin gate dielectric layer 418 is disposed or grown onto the substrate 420, and can be formed integrally with FOX layer 408A. A polysilicon gate 404 is formed onto gate layer 418. The gate 404 is suitable for receiving a gate contact (not shown). Sidewall spacers 406A, 406B are formed on either side of the gate 404.

Accordingly, an active region for the transistor 400 is defined under the gate 404. A channel for the transistor 400 is defined in the active region, within the p-well 402, between the n-well 414 and the n-well 410. The thick FOX layers 408A, 408B act as STI to prevent inadvertent channel formation outside of the active region of the transistor 400.

Gate 404 is comprised of portions 404A, 404B, and 404C. Portion 404A that is disposed over the surface region 411 has a length La that is at least as long as the length Lw of the region 411. Portion 404A and 404C are p+ doped, while portion 404B is n+ doped.

Figure 4B:
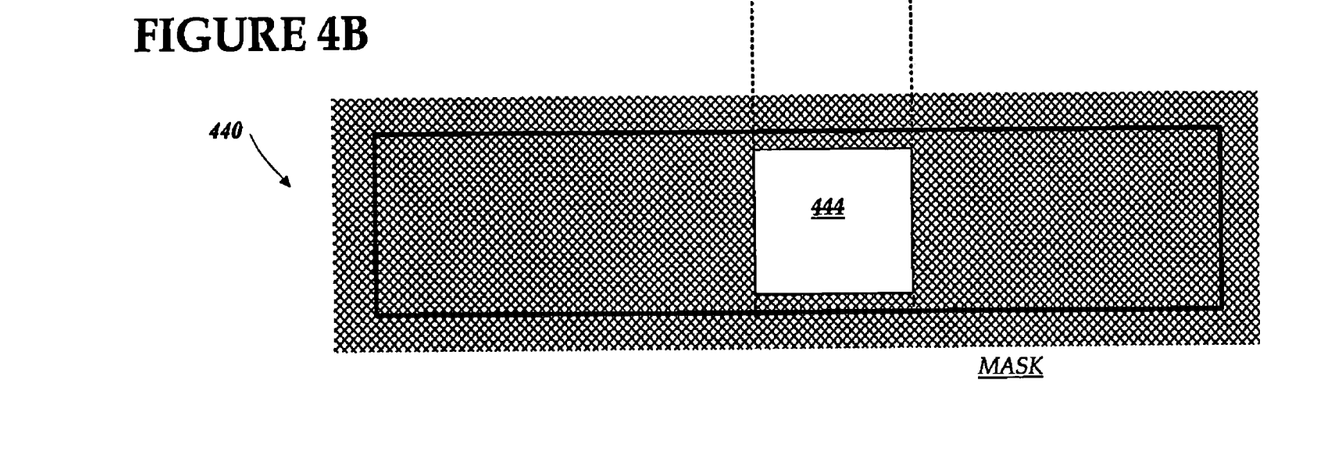
FIG. 4B is a top view of a mask that can be used in a CMOS process to form the FET of FIG. 4A.

FIG. 4B is a top view of a mask 440 that can be used in a CMOS process to form the FET 400 of FIG. 4A. The mask 440 is chosen to have an overall length in accordance with the overall length of the transistor 400. The mask 440 has an opening 444 that permits p-type material to go through at a part of the CMOS process where the gate 404 is being doped. Opening 444 has a length chosen so as to define gate portions 404A and 404C. That is also indicated by two trace lines from FIG. 4A to FIG. 4B.

Figure 5:
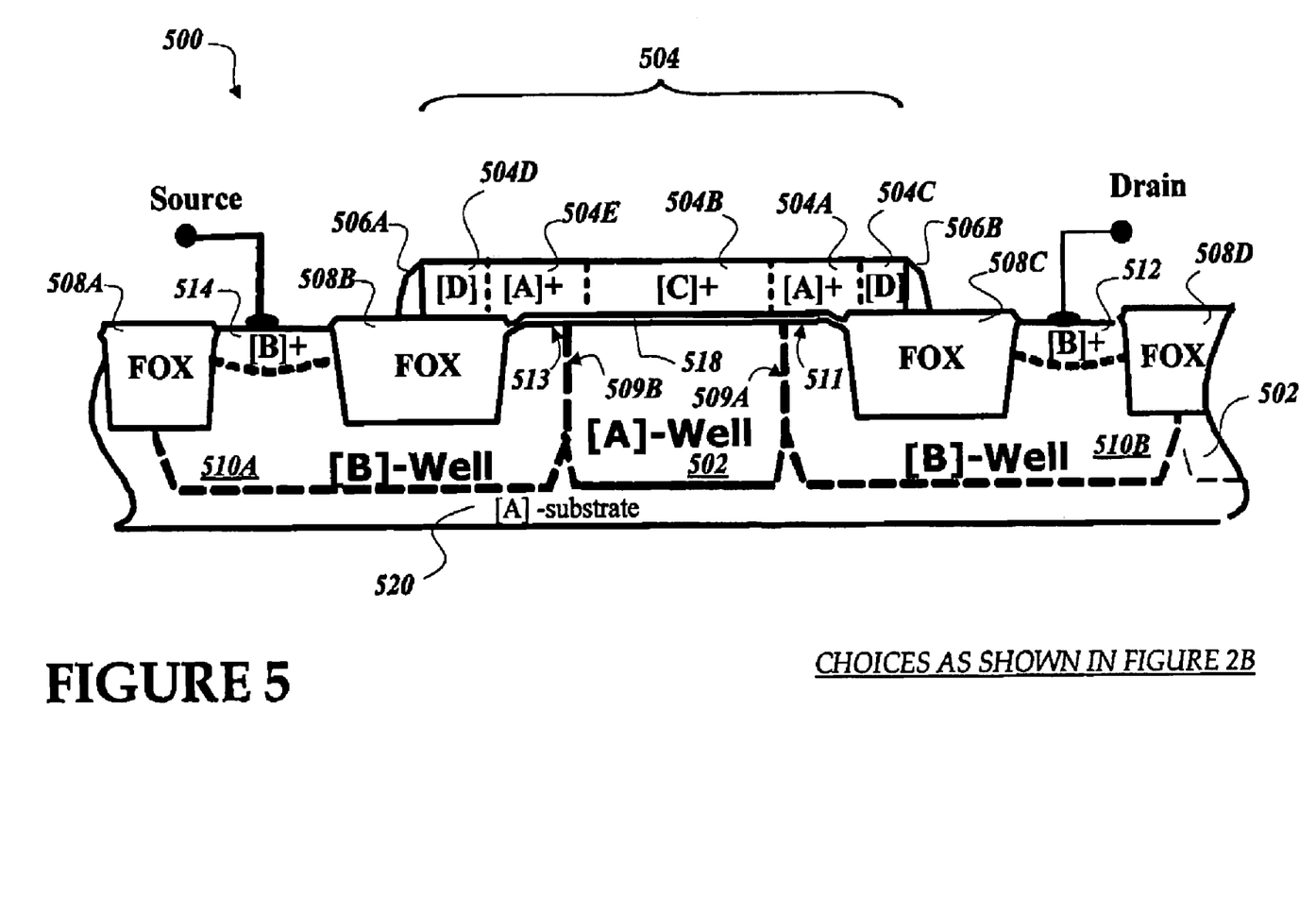
FIG. 5 is a cross-sectional view of another high voltage CMOS FET whose gate is structured according to embodiments.

FIG. 5 is a cross-sectional view of another high voltage CMOS FET 500, whose gate is structured according to embodiments. The transistor 500 is described in terms of areas and regions, for some of which there is a choice in doping. The choices are indicated by variables [A], [B], [C], and [D], and they are the same choices as those of FIG. 2B.

In FIG. 5A, the transistor 500 includes a substrate 520. The substrate 520 is preferably doped according to the [A−] variable. A first well 502 formed in the substrate 520 includes doped implants of the [A] type. The first well 502 appears in two places, for reasons similar to what was described with reference to FIG. 2A.

A second well 510B, formed in the substrate 520, includes doped implants of the [B] type. The second well 510B is adjacent to the first well 502, well and defines a first natural p-n junction 509A with the first well 502.

A first FOX layer 508C is formed within the second well 510B. Accordingly, the FOX layer 508C defines a first surface region 511 of the second well 510B. The FOX layer 508C further defines a second surface region of the second well 510B, which is adapted to receive a drain contact via a region 512 that is heavily doped according to the [B]+ type.

A third well 510A, formed in the substrate 520, includes doped implants of the [B] type. The third well 510A is adjacent to the first well 502, well and defines a second natural p-n junction 509B with the first well 502.

A second FOX layer 508B is formed within the third well 510A. Accordingly, the FOX layer 508B defines a first surface region 513 of the third well 510A. The FOX layer 508B further defines a second surface region of the third well 510A, which is adapted to receive a source contact via a region 514 that is heavily doped according to the [B]+ type.

The transistor 500 also includes additional FOX layers 508A and/or 508D at edges of the wells 510B, 510A. Accordingly, these permit placing an ohmic contact (not shown) for the body of the substrate 520 via the first well 502 near the source contact or the drain contact.

A thin gate dielectric layer 518 is disposed or grown onto the substrate 520. The layer 518 can be formed integrally with FOX layers 508C and 508B.

A polysilicon gate 504 is formed onto gate layer 518. The gate 504 is suitable for receiving a gate contact (not shown). Sidewall spacers 506A, 506B are formed on either side of the gate 504.

Accordingly, an active region for the transistor 500 is defined under the gate 504. A channel for the transistor 500 is defined in the active region, within the first well 502, between the second well 510B and the third well 510A. The FOX layers 508A, 508B, 508C and 508D act as STI to prevent inadvertent channel formation outside of the active region of the transistor 500.

The gate 504 can be considered as either unitary, or comprised of any combination of portions 504A, 504B, 504C, 504D, 504E, which can be doped similarly or differently, according to combinations illustrated in FIG. 2B. Portion 504B is doped according to variable [C]+, and portions 504C, 504D are doped according to variable [D].

Portion 504A of the gate 504 is disposed over the first natural p-n junction. Portion 504E of the gate 504 is disposed over the second natural p-n junction. Preferably, the portion 504A and portion 504E extend over the entire respective first surface regions 511, 513, in a manner similar to what was described with reference to FIG. 2A.

Portions 504A, 504E are doped similarly to that of the first well 502 (here, type [A]). Accordingly, portions 504A, 504E are doped oppositely to how the second well 510B and the third well 510A are doped at their respective first surface regions 511, 513. As per the above, this type of doping enhances the breakdown voltage at natural p-n junctions formed by the first well 502 with each of the second well 510B and the third well 510A.

It will be appreciated that the various possibilities of the matrix 216 of FIG. 2B result in this desired effect. For example, the entire gate 504 can doped as the portions 504A and 504E. Alternately, different portions of the gate can be doped differently. A third portion can be doped differently than the first portion 504A, whether the third portion is the portion 504B (located over the channel), or the portion 504C.

It should be noted that the doping of the portions 504C and 504D does not matter. In fact, the portions 504C and 504D need not be doped at all. It is therefore advantageous to have the portions 504C and 504D be doped the same as the portion 504A. One such example is described below.

Figure 6:
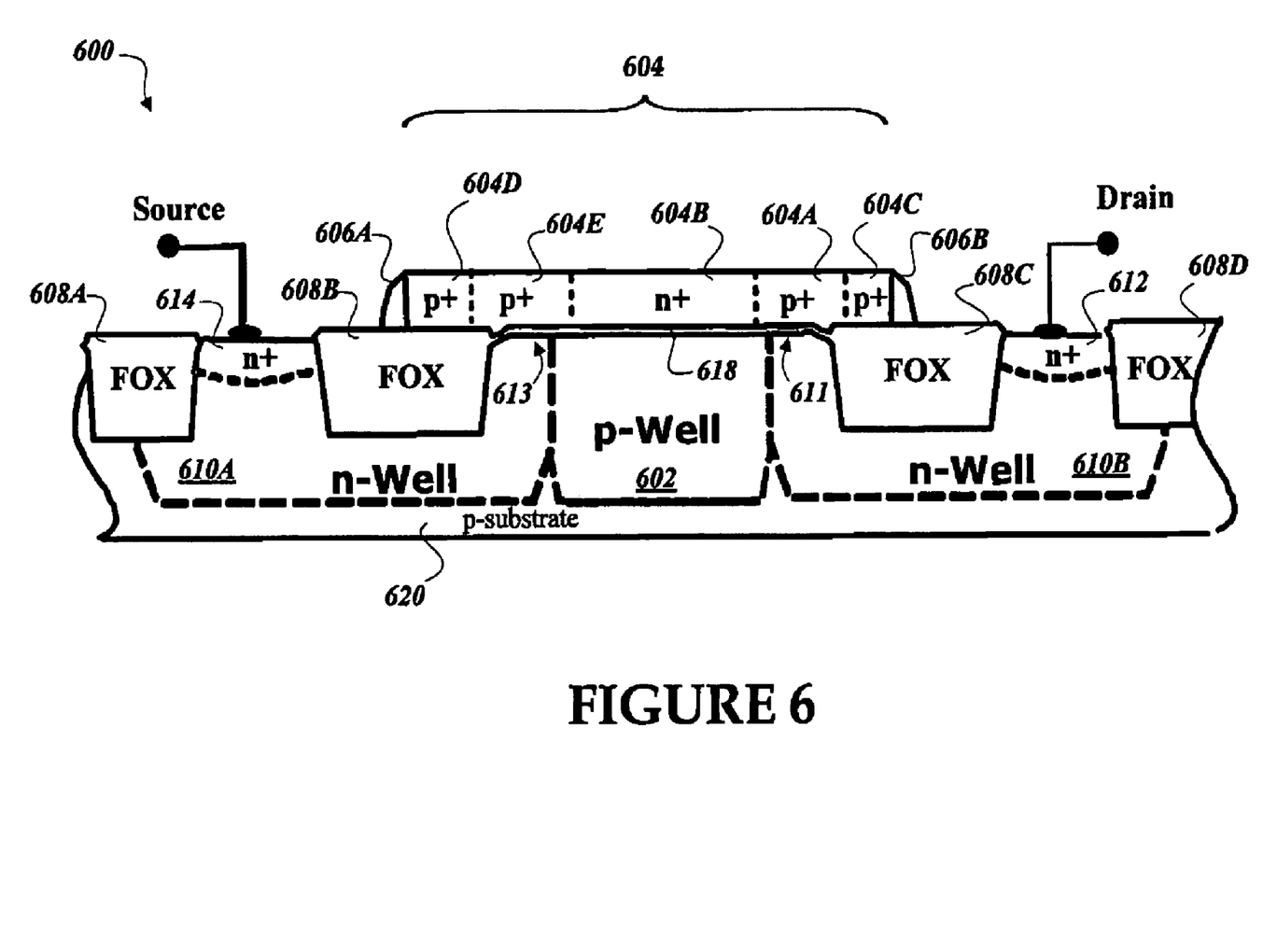
FIG. 6 is a cross-sectional view of an exemplary high voltage n-channel CMOS FET resulting from applying the choices of FIG. 3 to the FET of FIG. 5.

FIG. 6 is a cross-sectional view of an exemplary high voltage n-channel CMOS FET 600 resulting from applying the choices of FIG. 3 to the FET of FIG. 5.

The transistor 600 includes a p-substrate 620. A p-well 602, an n-well 610B, and an n-well 610A are formed in the substrate 620. A first FOX layer 608C is within the n-well 610B, so as to define a first surface region 611 of the n-well 610. The FOX layer 608C further defines a second surface region of the n-well 610, which is adapted to receive a drain contact via a richly doped region 612. A second FOX layer 608B is within the n-well 610A, so as to define a first surface region 613 of the n-well 610. The FOX layer 608B further defines a second surface region of the n-well 610, which is adapted to receive a source contact via a richly doped region 614. Other FOX layers 608D, 608A, permit placing an ohmic contact (not shown) for the body of the substrate 620 via the first well 602 near the drain contact or the source contact.

A thin gate dielectric layer 618 is disposed or grown onto the substrate 620, and can be formed integrally with FOX layers 608C and 608B. A polysilicon gate 604 is formed onto gate layer 618. The gate 604 is suitable for receiving a gate contact (not shown). Sidewall spacers 606A, 606B are formed on either side of the gate 604.

Accordingly, an active region for the transistor 600 is defined under the gate 604. A channel for the transistor 600 is defined in the active region, within the first well 602, between the second well 610B and the third well 610A. The FOX layers 608A, 608B, 608C and 608D act as STI to prevent inadvertent channel formation outside of the active region of the transistor 600.

Gate 604 is comprised of portions 604A, 604B, 604C, 604D, 604E. Portion 604A is disposed over the surface region 611, and portion 604E is disposed over the surface region 613. Portions 604A, 604C, 604D and 604E are p+ doped, while portion 604B is n+ doped.

Embodiments of the present invention also include methods for forming the devices above. The methods can be practiced in view of the present description, for forming the transistors mentioned above.

While embodiments of the invention has been illustrated and described, it will be appreciated that various changes can be made therein without departing from the spirit and scope of the invention.

What is claimed is:

1. A FET comprising:
   a substrate that includes implants of a first type;
   a first well in the substrate that includes doped implants of the first type;
   a second well in the substrate that includes doped implants of a second type, the second well adjacent to the first well and defining a natural p-n junction with the first well;
   a field oxide layer within the second well that defines a first surface region and a second surface region of the second well, wherein the second surface region of the second well is adapted to receive a drain contact, and wherein the field oxide layer is outside the first well;
   a third well located at least partially in the first well, the third well including doped implants of the second type and adapted to receive a source contact, the third well thereby defining a channel between it and the second well within the first well; and
   a gate disposed over the channel, wherein at least a first portion of the gate is doped with implants of one of the first type and the second type the first portion being disposed substantially over the first well, wherein a second portion of the gate adjacent to the first portion is disposed substantially over the natural p-n junction the second portion including doped implants of the first type, and wherein a third portion of the gate adjacent to the second portion but not the first portion is disposed over the field oxide layer within the second well.

2. The FET of claim 1, wherein
   the first surface region is adjacent to the natural p-n junction, and
   the first portion of the gate extends over the entire first surface region.

3. The FET of claim 1, wherein the doped implants of the first type are n-type and the doped implants of the second type are p-type.

4. The FET of claim 1, wherein the doped implants of the first type are p-type and the doped implants of the second type are n-type.

5. The FET of claim 1, wherein a boundary between the first portion and the second portion of the gate is over the channel.

6. The FET of claim 1, wherein the second portion of the gate is located over the channel.

7. The FET of claim 1, wherein the third portion of the gate is not doped.

8. A FET comprising:
   a substrate that includes implants of a first type;
   a first well in the substrate that includes doped implants of the first type;
   a second well in the substrate that includes doped implants of a second type, the second well adjacent to the first well and defining a first natural p-n junction with the first well;
   a first field oxide layer within the second well that defines a first surface region of the second well and a second surface region of the second well, wherein the second surface region of the second well is adapted to receive a drain contact, and wherein the first field oxide layer is outside the first well;
   a third well in the substrate that includes doped implants of the second type, the third well adjacent to the first well in an opposite direction of the second well and defining a second natural p-n junction with the first well;
   a second field oxide layer within the third well that defines a first surface region of the third well and a second surface region of the third well, wherein the second surface region of the third well is adapted to receive a source contact, the third well thereby defining a channel between it and the second well within the first well; and
   a gate disposed over the channel, at least a first portion of the gate being disposed over the first natural p-n junction and a second portion of the gate being disposed over the second natural p-n junction, the first and second portions of the gate including doped implants of the first type, wherein a third portion of the gate between the first and second portions is doped with implants of one of the first type and the second type and is disposed substantially over the first well, and wherein a fourth and fifth portions of the gate adjacent to the first and second portions, respectively away from the third portion are disposed over the first and second field oxide layers.

9. The FET of claim 8, wherein
the first surface region of the second well is adjacent to the first natural p-n junction, and
the first portion of the gate extends over the entire first surface region of the second well.

10. The FET of claim 9, wherein
the first surface region of the third well is adjacent to the second natural p-n junction, and
the second portion of the gate extends over the entire first surface region of the third well.

11. The FET of claim 8, wherein the doped implants of the first type are n-type and the doped implants of the second type are p-type.

12. The FET of claim 8, wherein the doped implants of the first type are p-type and the doped implants of the second type are n-type.

13. The FET of claim 8, wherein a first boundary between the first portion and the third portion and a second boundary between the second portion and the third portion are over the channel.

14. The FET of claim 8, wherein the third portion is located over the channel.

* * * * *